(12) United States Patent
Chao et al.

(10) Patent No.: US 11,276,697 B2
(45) Date of Patent: Mar. 15, 2022

(54) FLOATING BODY METAL-OXIDE-SEMICONDUCTOR FIELD-EFFECT-TRANSISTORS (MOSFET) AS ANTIFUSE ELEMENTS

(71) Applicant: Intel Corporation, Santa Clara, CA (US)

(72) Inventors: Yu-Lin Chao, Portland, OR (US); Sarvesh H. Kulkarni, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 834 days.

(21) Appl. No.: 15/943,548

(22) Filed: Apr. 2, 2018

(65) Prior Publication Data

US 2019/0304989 A1 Oct. 3, 2019

(51) Int. Cl.
| | |
|---|---|
| *H01L 27/112* | (2006.01) |
| *H01L 23/525* | (2006.01) |
| *H01L 21/8238* | (2006.01) |
| *H01L 27/11* | (2006.01) |
| *H01L 29/78* | (2006.01) |

(52) U.S. Cl.
CPC .... *H01L 27/11206* (2013.01); *H01L 21/8238* (2013.01); *H01L 23/5252* (2013.01); *H01L 27/1104* (2013.01); *H01L 29/7841* (2013.01)

(58) Field of Classification Search
CPC ............. H01L 29/7841; H01L 23/5252; H01L 23/5254; H01L 27/11206
See application file for complete search history.

(56) References Cited

U.S. PATENT DOCUMENTS

| | | | |
|---|---|---|---|
| 8,116,130 B1 * | 2/2012 | Ratnakumar | H01L 23/5256 365/177 |
| 9,589,971 B1 * | 3/2017 | Chang | H01L 28/00 |
| 2009/0206381 A1 * | 8/2009 | Shin | H01L 27/11206 257/300 |
| 2009/0251201 A1 * | 10/2009 | Sung | G11C 11/5692 327/525 |

(Continued)

FOREIGN PATENT DOCUMENTS

WO WO-2012134585 A1 * 10/2012 ......... H01L 27/0207

*Primary Examiner* — Victoria K. Hall
(74) *Attorney, Agent, or Firm* — Schwabe, Williamson & Wyatt, P.C.

(57) ABSTRACT

Embodiments herein may describe techniques for an integrated circuit including a MOSFET having a semiconductor well, a source area and a drain area next to the semiconductor well, a gate electrode, and a base terminal. The gate electrode may be coupled to the base terminal, hence forming a floating body MOSFET. A junction may exist between the drain area and the semiconductor well. A first resistance may exist between the source area and the drain area through the semiconductor well. A programming operation may be performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area. Other embodiments may be described and/or claimed.

24 Claims, 7 Drawing Sheets

(56) References Cited

U.S. PATENT DOCUMENTS

| | | | |
|---|---|---|---|
| 2010/0265755 A1* | 10/2010 | Ching | H01L 27/112 |
| | | | 365/104 |
| 2011/0079875 A1* | 4/2011 | Shin | H01L 23/5254 |
| | | | 257/530 |
| 2011/0272758 A1* | 11/2011 | Banerjee | H01L 27/0629 |
| | | | 257/328 |
| 2012/0080736 A1* | 4/2012 | Onuma | H01L 23/5252 |
| | | | 257/314 |
| 2012/0248546 A1* | 10/2012 | Tong | H01L 21/44 |
| | | | 257/379 |
| 2014/0138777 A1* | 5/2014 | Wang | H01L 27/101 |
| | | | 257/379 |
| 2015/0235945 A1* | 8/2015 | Kirihata | H01L 21/743 |
| | | | 257/530 |
| 2016/0351498 A1* | 12/2016 | Chang | H01L 27/1021 |
| 2018/0019248 A1* | 1/2018 | Kasai | H01L 27/11206 |
| 2018/0047735 A1* | 2/2018 | Jeong | H01L 29/16 |
| 2018/0047736 A1* | 2/2018 | Seo | G11C 17/16 |
| 2018/0061755 A1* | 3/2018 | Yamamoto | H01L 23/5252 |
| 2018/0166382 A1* | 6/2018 | Lee | H01L 27/101 |
| 2018/0211951 A1* | 7/2018 | Luo | H01L 27/0277 |
| 2019/0304894 A1* | 10/2019 | Dorgan | H01L 29/51 |
| 2019/0304906 A1* | 10/2019 | Dorgan | H01L 29/41791 |
| 2019/0304907 A1* | 10/2019 | Chao | H01L 27/0251 |

\* cited by examiner

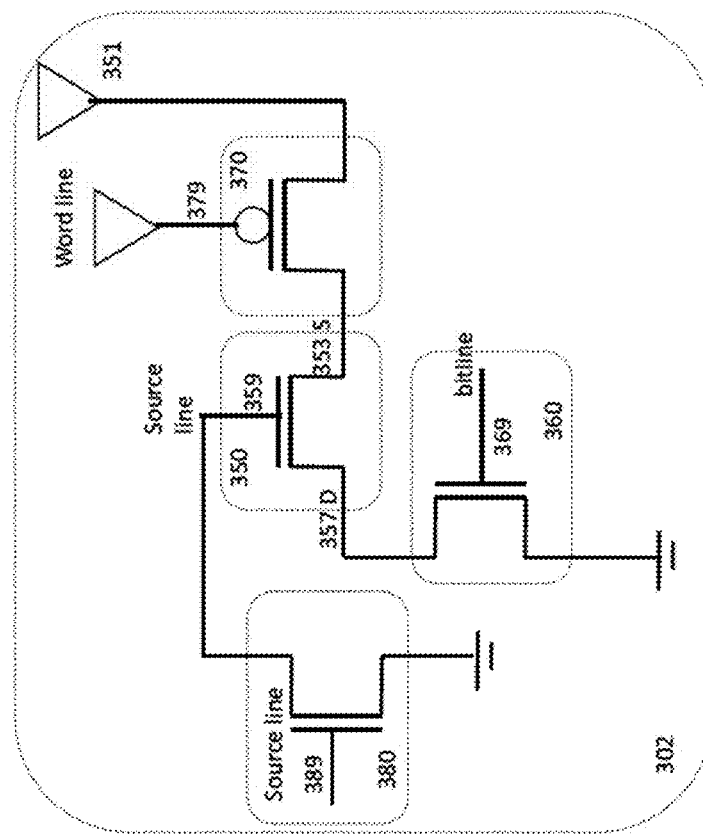
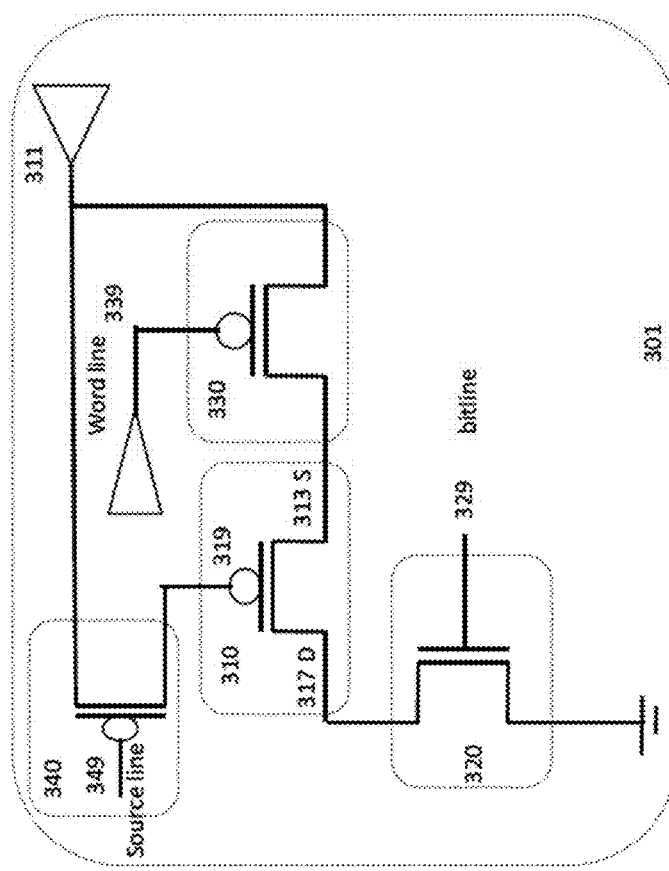
Figure 3(a)
Figure 3(b)

FLOATING BODY METAL-OXIDE-SEMICONDUCTOR FIELD-EFFECT-TRANSISTORS (MOSFET) AS ANTIFUSE ELEMENTS

FIELD

Embodiments of the present disclosure generally relate to the field of integrated circuits, and more particularly, to antifuse elements and memory arrays.

BACKGROUND

An integrated circuit (IC) may include many components, e.g., transistors, resistors, capacitors, diodes, formed on a semiconductor substrate. In addition, ICs may often include one or more types of memory arrays formed by multiple memory cells, such as a CMOS memory array including multiple memory cells, an antifuse memory array including multiple antifuse elements, or a fuse memory array including multiple fuse elements. In electronics and electrical engineering, a fuse element may be an electrical safety device that operates to provide overcurrent protection of an electrical circuit. Normally, a fuse element may include a copper wire, strip, or interconnect, which may melt or break down when too much current flows through it, thereby interrupting the current. A fuse element with a copper wire may melt at a high current, and may create a void space in the fuse element after the copper wire has been melted, which may post security risks. In addition, a fuse memory array including multiple fuse elements with copper wire may occupy a large area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3(a)-3(b) schematically illustrate diagrams of floating body MOSFETs coupled with selectors to be used as an antifuse cell, in accordance with some embodiments.

DETAILED DESCRIPTION

Figure 1A:
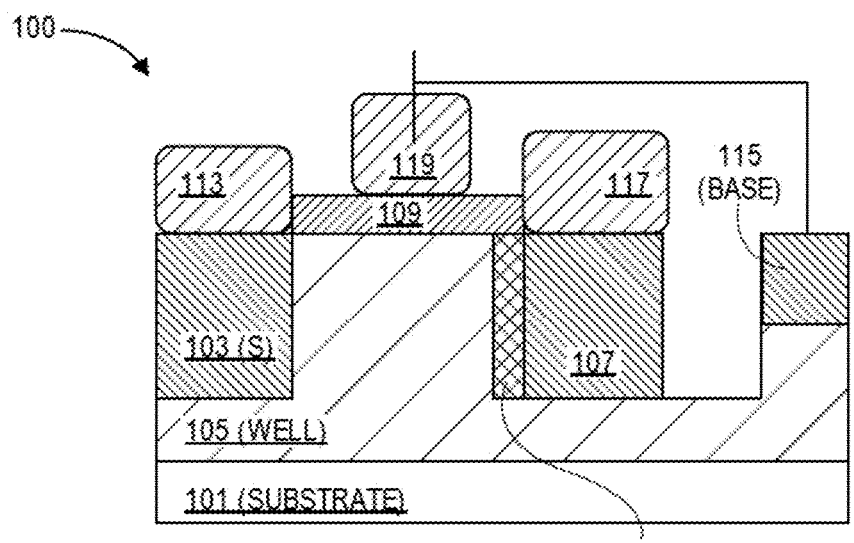
FIGS. 1(a)-1(c) schematically illustrate diagrams of a floating body metal-oxide-semiconductor field-effect-transistor (MOSFET) to be used as an antifuse element having a gate electrode coupled to a base terminal, and a junction between a drain area and a semiconductor well, in accordance with some embodiments.

A fuse element may be an electrical safety device that operates to provide overcurrent protection of an electrical circuit. Conventionally, a fuse element may include a copper interconnect. A copper interconnect of a fuse element may melt at a high current, e.g., around 10 milliamps (mA) to 30 mA, when a high voltage, e.g., 5 voltage, is applied to the fuse element. After the copper interconnect of the fuse element has been melted, the fuse element may include a void space that was occupied by the copper interconnect before it has been melted. Such a void space may be detectable by top-down imaging techniques, hence making the fuse element vulnerable for security reasons. In addition, a fuse memory array including multiple fuse elements having copper interconnects may occupy a large area.

An antifuse element may be an electrical device that performs operations opposite to a fuse element. Whereas a fuse element starts with a low resistance and may permanently break an electrically conductive path (typically when the current through the path exceeds a specified limit), an antifuse element starts with a high resistance and may permanently create an electrically conductive path (typically when the voltage across the antifuse element exceeds a certain level). A memory array may be formed by including multiple antifuse elements, or multiple fuse elements.

A bipolar transistor may include two PN-junctions having three connecting terminals: an emitter, a base, and a collector. A metal-oxide-semiconductor field-effect-transistor (MOSFET) may include a source area, a gate electrode, a semiconductor well, a body formed by the semiconductor well, and a drain area. A bipolar transistor may co-exist with a MOSFET, with a drain area and a source area serving as a collector/emitter, and its body being a base of the bipolar transistor. Embodiments herein may exploit collector-emitter avalanche breakdown of a bipolar transistor in a MOSFET. A first resistance may exist between the source area and the drain area through the semiconductor well of the MOSFET. A base, e.g., a body or a semiconductor well, and a gate electrode of a MOSFET may be coupled together, and left open as floating or high impedance. Such a MOSFET may be referred to as a floating body MOSFET. A collector, e.g., a drain area, may be biased at a lower voltage relative to an emitter, e.g., a source area, leaving a junction between the collector and the base, e.g., a junction between the drain area and the body in the MOSFET, reversed biased. A programming operation may be performed when the gate electrode and the base are coupled to a high impedance, a programming voltage is applied at the source area, and the drain area is coupled to a ground voltage to break the junction between the drain area and the semiconductor well to generate a current between the source area, the semiconductor well, and the drain area. A second resistance may exist between the source area, the drain area, and the semiconductor well, after the programming operation. As a result, the first resistance is about 104 to 106 times larger than the second resistance. The two different resistances may be used to represent a digital 0 and a digital 1, respectively. After a programming operation is performed on the floating body MOSFET to break the junction between the drain area and the semiconductor well, no void space is created within the floating body MOSFET. Therefore an antifuse element including the floating body MOSFET may be safer compared to a fuse element including a copper interconnect.

Embodiments herein may present an integrated circuit (IC) including a source area adjacent to a semiconductor well and above a substrate, a drain area adjacent to the semiconductor well and above the substrate, a base terminal coupled to the semiconductor well, and a gate electrode above the semiconductor well. The source area, the semiconductor well, the gate electrode, and the drain area may form a MOSFET. The gate electrode may be coupled to the base terminal, hence forming a floating body MOSFET. A junction may exist between the drain area and the semiconductor well. A first resistance may exist between the source area and the drain area through the semiconductor well. A programming operation may be performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

Embodiments herein may present a method for forming an IC. The method may include: forming a source area adjacent to a semiconductor well and above a substrate; forming a drain area adjacent to the semiconductor well and above the substrate; forming a base terminal coupled to the semiconductor well; and forming a gate electrode above the semiconductor well, the gate electrode coupled to the base terminal. The source area, the semiconductor well, the gate electrode, and the drain area may form a MOSFET. The gate electrode coupled to the base terminal may form a floating body MOSFET. A junction may exist between the drain area and the semiconductor well. A first resistance may exist between the source area and the drain area through the semiconductor well. A programming operation may be performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

Embodiments herein may present a computing device including a circuit board and an antifuse memory array coupled to the circuit board. The antifuse memory array may include a plurality of antifuse cells. An antifuse cell of the plurality of antifuse cells may include an antifuse element coupled to a first selector and a second selector. The antifuse element may include a source area adjacent to a semiconductor well and above a substrate, a drain area adjacent to the semiconductor well and above the substrate, a base terminal coupled to the semiconductor well, and a gate electrode above the semiconductor well, the gate electrode coupled to the base terminal. The source area, the semiconductor well, the gate electrode, and the drain area may form a MOSFET. The gate electrode coupled to the base terminal may form a floating body MOSFET. A junction may exist between the drain area and the semiconductor well. The source area may be coupled to a word line of the antifuse memory array through the first selector. The drain area may be coupled to a bit line of the antifuse memory array through the second selector. The gate electrode may be coupled to a source line of the antifuse memory array. A first resistance may exist between the source area and the drain area through the semiconductor well. A programming operation may be performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
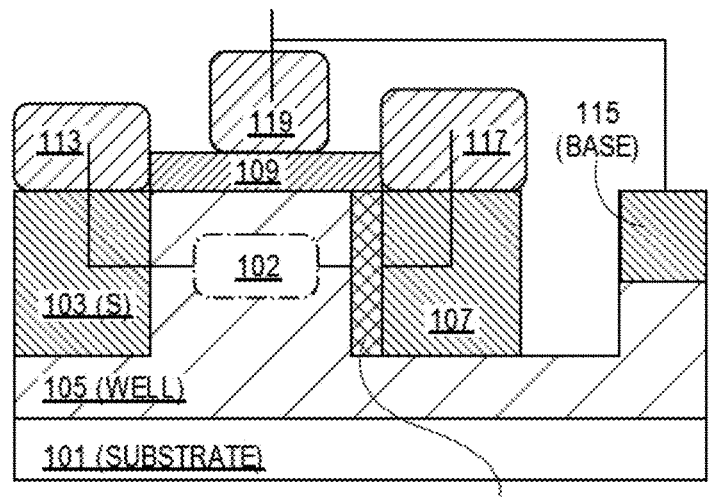
Figure 1C:
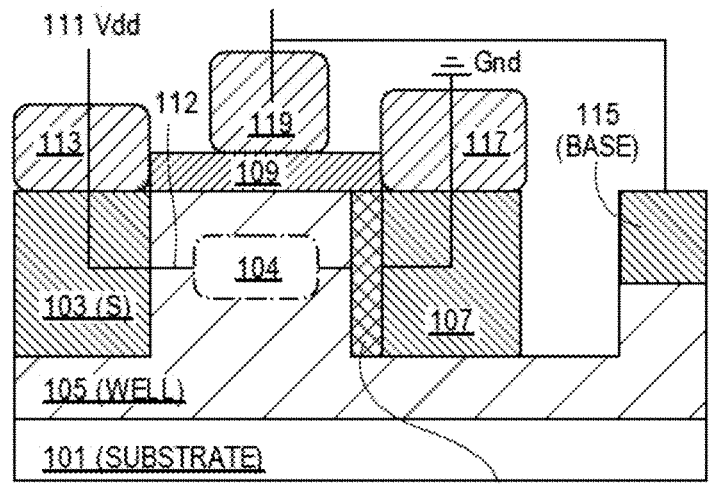

FIGS. 1(a)-1(c) schematically illustrate diagrams of a floating body MOSFET 100 to be used as an antifuse element having a gate electrode 119 coupled to a base terminal 115, and a junction 106 between a drain area 107 and a semiconductor well 105, in accordance with some embodiments. For clarity, features of the MOSFET 100, the gate electrode 119, the base terminal 115, the junction 106, the drain area 107, and the semiconductor well 105 may be described below as examples for understanding an example MOSFET, a gate electrode, a base terminal, a junction, a drain area, and a semiconductor well. It is to be understood that there may be more or fewer components within a MOSFET, a gate electrode, a base terminal, a junction, a drain area, and a semiconductor well. Further, it is to be understood that one or more of the components within a MOSFET, a gate electrode, a base terminal, a junction, a drain area, and a semiconductor well may include additional and/or varying features from the description below, and may include any device that one having ordinary skill in the art would consider and/or refer to as a MOSFET, a gate electrode, a base terminal, a junction, a drain area, and a semiconductor well.

In embodiments, as shown in FIG. 1(a), the MOSFET 100 may be a PMOS MOSFET or a NMOS MOSFET, a FinFET, or a planar MOSFET. The MOSFET 100 may include a substrate 101, the semiconductor well 105 above the substrate 101, a source area 103 adjacent to the semiconductor well 105 and above the substrate 101, the drain area 107 adjacent to the semiconductor well 105 and above the substrate 101, the base terminal 115 coupled to the semiconductor well 105, and the gate electrode 119 above the semiconductor well 105 and coupled to the base terminal 115. The semiconductor well 105 may be an n-type well or a p-type well. A source electrode 113 may be in contact with the source area 103, and a drain electrode 117 may be in contact with the drain area 107. A gate oxide layer 109 may be above the semiconductor well 105, and the gate electrode 119 may be above the gate oxide layer 109. The junction 106 may exist between the drain area 107 and the semiconductor well 105.

In embodiments, the substrate 101 may be a bulk substrate, a silicon-on-insulator (SOI) substrate, or a partial-depleted SOI substrate. The source electrode 113, the gate electrode 119, or the drain electrode 117 may include germanium (Ge), cobalt (Co), titanium (Ti), tantalum (Ta), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

In embodiments, as shown in FIG. 1(b), a first resistance 102 may exist between the source area 103 and the drain area 107 through the semiconductor well 105. The resistance 102 represented by a symbol may be a symbolic view to show a resistance, not a real physical component.

In embodiments, as shown in FIG. 1(c), the gate electrode 119 may be coupled to a high impedance together with the base terminal 115, when a programming voltage 111 may be applied at the source area 103, and the drain area 107 may be coupled to a ground voltage to break the junction 106 between the drain area 107 and the semiconductor well 105. A current 112 may be generated between the source area 103, the semiconductor well 105, and the drain area 107. After the programming operation is performed, a second resistance 104 may exist between the source area 103, the drain area 107, and the semiconductor well 105 with the junction 106 broken between the drain area 107 and the semiconductor well 105.

When programming voltage 111 may be applied at the source area 103, and the drain area 107 may be coupled to a ground voltage, a junction between a collector to a base, or the junction 106 between the drain area 107 to the body in a MOSFET, may be reversed biased. When the voltage drop across the junction 106 may be high enough for the drift electrons and holes to gain sufficient energy to ionize silicon atoms and generate additional electron-hole pairs, an avalanche event may occur. Due to the open-base configuration at the gate electrode 119 together with the base terminal 115 coupled to a high impedance, electrons generated in the avalanche event may enter into the base, e.g., the semiconductor well 105, as majority carriers, and may be further injected into the emitter, e.g., the source area 103. The electrons injected into the emitter, e.g., the source area 103, may significantly increase the number of holes being ejected from the emitter, e.g., the source area 103, to the base, the semiconductor well 105, for charge balancing. The operations of the increased number of holes may increase an overall collector current, e.g., the current 112. By selecting the programming voltage 111 at an appropriate value and duration, the breakdown current, e.g., the current 112, may create permanent defects in the MOSFET 100, e.g., to break the junction between the drain area and the semiconductor well. As a result, after the programming operation is performed, the second resistance 104 may exist between the source area 103, the drain area 107, and the semiconductor well 105 with the junction 106 broken between the drain area 107 and the semiconductor well 105.

In embodiments, the programming operation may be performed when the MOSFET 100 is in an off state. The first resistance 102 may be about 104 to 106 times larger than the second resistance 104. Hence, the first resistance 102 and the second resistance 104 of the MOSFET 100 may represent a digital 0 and a digital 1, or a digital 1 and a digital 0, respectively. The MOSFET 100 may be programmed to be 0 or 1, without creating a void space within the MOSFET 100. Hence, the MOSFET 100 may be more secure than a fuse element including a copper interconnect, which may leave a void space once the copper interconnect is melted after a programming voltage is applied to the fuse element. The MOSFET 100 may be used to store security keys on-die, and its stored content may not be able to be discovered by imaging inspection of the void spaces contained in the MOSFET 100.

When used as an antifuse element, the MOSFET 100 may leverage both scaled MOSFET features and bipolar transistor physics to enable the programming operation to be performed at a reduced voltage, e.g., the voltage 111. For example, the programming voltage 111 may be less than about 2.5 V between the source area 103 and the drain area 107, while the current 112 may reach sub milliamp (mA), e.g., less than about 1 nanoamp (nA), due to low post-programming resistance.

Figure 2:
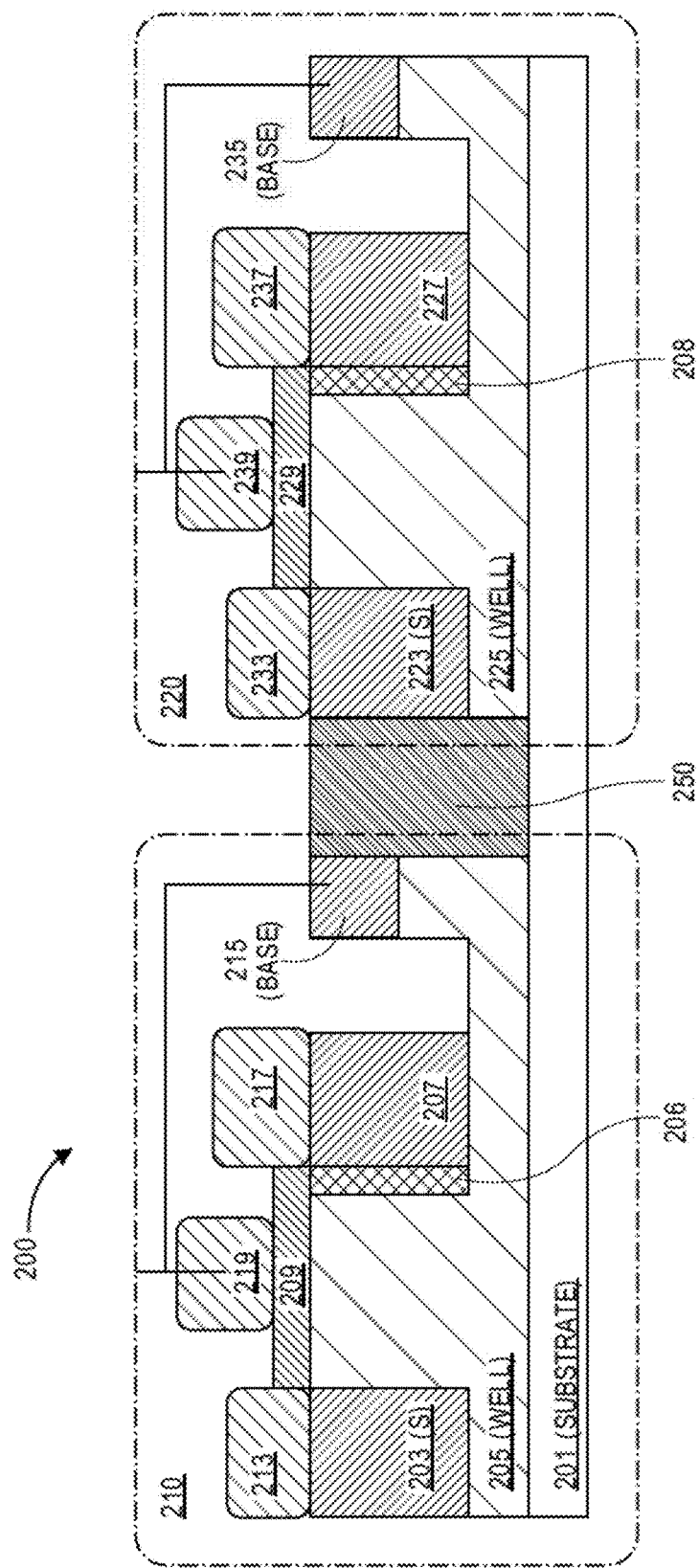
FIG. 2 schematically illustrates a diagram of an integrated circuit (IC) including two floating body MOSFETs to be used as antifuse elements above two separated semiconductor wells, each MOSFET having a junction between a drain area and a semiconductor well, in accordance with some embodiments.

FIG. 2 schematically illustrates a diagram of an IC 200 including two floating body MOSFETs, e.g., a MOSFET 210 and a MOSFET 220, to be used as antifuse elements above two separated semiconductor wells, each MOSFET having a junction between a drain area and a semiconductor well, in accordance with some embodiments. In embodiments, the MOSFET 210, or the MOSFET 220 may be an example of the MOSFET 100 shown in FIG. 1.

In embodiments, the IC 200 may be formed on a substrate 201, and may include the MOSFET 210, the MOSFET 220, separated by an isolation area 250. The MOSFET 210 may include the substrate 201, a semiconductor well 205 above the substrate 201, a source area 203 adjacent to the semiconductor well 205 and above the substrate 201, a drain area 207 adjacent to the semiconductor well 205 and above the substrate 201, a base terminal 215 coupled to the semiconductor well 205, and a gate electrode 219 above the semiconductor well 205 and coupled to the base terminal 215. A source electrode 213 may be in contact with the source area 203, and a drain electrode 217 may be in contact with the drain area 207. A gate oxide layer 209 may be above the semiconductor well 205, and the gate electrode 219 may be above the gate oxide layer 209. A junction 206 may exist between the drain area 207 and the semiconductor well 205. The base terminal 215 may be coupled to the gate electrode 219 to form a floating body for the MOSFET 210.

Similarly, the MOSFET 220 may include the substrate 201, a semiconductor well 225 above the substrate 201, a source area 223 adjacent to the semiconductor well 225 and above the substrate 201, a drain area 227 adjacent to the semiconductor well 225 and above the substrate 201, a base terminal 235 coupled to the semiconductor well 225, and a gate electrode 239 above the semiconductor well 225 and coupled to the base terminal 235. A source electrode 233 may be in contact with the source area 223, and a drain electrode 237 may be in contact with the drain area 227. A gate oxide layer 229 may be above the semiconductor well 225, and the gate electrode 239 may be above the gate oxide layer 229. A junction 208 may exist between the drain area 227 and the semiconductor well 225. The base terminal 235 may be coupled to the gate electrode 239 to form a floating body for the MOSFET 220.

In embodiments, a first resistance may exist between the source area 203 and the drain area 207 through the semiconductor well 205. The gate electrode 219 may be coupled to a high impedance together with the base terminal 215. A programming voltage may be applied at the source area 203, and the drain area 207 may be coupled to a ground voltage to break the junction 206 between the drain area 207 and the semiconductor well 205 to generate a current between the source area 203, the semiconductor well 205, and the drain area 207. The current may create permanent defects, e.g., breaking the junction 206 between the drain area 207 and the semiconductor well 205 in the MOSFET 210. After the programming operation, a second resistance may exist between the source area 203, the drain area 207, and the semiconductor well 205. The first resistance may be about 104 to 106 times larger than the second resistance.

Furthermore, a third resistance may exist between the source area 223 and the drain area 227 through the semiconductor well 225. The gate electrode 239 may be coupled to a high impedance together with the base terminal 235. A programming voltage may be applied at the source area 223, and the drain area 227 may be coupled to a ground voltage to break the junction 208 between the drain area 227 and the semiconductor well 225 to generate a current between the source area 223, the semiconductor well 225, and the drain area 227. The current may create permanent defects, e.g., breaking the junction 208 between the drain area 227 and the semiconductor well 225 in the MOSFET 220. After the programming operation, a fourth resistance may exist between the source area 223, the drain area 227, and semiconductor well 225. The third resistance may be about 104 to 106 times larger than the fourth resistance.

FIGS. 3(*a*)-3(*b*) schematically illustrate diagrams of floating body MOSFETs, e.g., a MOSFET 310, or a MOSFET 350, coupled with selectors to be used as an antifuse cell, e.g., an antifuse cell 301, or an antifuse cell 302, in accordance with some embodiments. In embodiments, the MOSFET 310, or the MOSFET 350, may be an example of the MOSFET 100 shown in FIG. 1.

In embodiments, as shown in FIG. 3(*a*), the antifuse cell 301 may include the MOSFET 310, which may be a PMOS MOSFET, coupled with a selector 320 and a selector 330. The MOSFET 310 may include a gate electrode 319, a source electrode 313, and a drain electrode 317. The MOSFET 310 may be used as an antifuse element. A programming operation may be performed when a programming voltage 311 may be applied to the source electrode 313 through the selector 330, the drain electrode 317 coupled to the ground voltage through the selector 320. The selector 330 may be coupled to a word line 339 through a gate electrode, and the selector 320 may be coupled to a bit line 329 through a gate electrode. In addition, the gate electrode 319 may be coupled to a high impedance, which may be controlled by a controller 340. For example, the controller 340 may be a PMOS transistor, with a gate electrode being held high so that the gate electrode 319 of the MOSFET 310 is in a high impedance. The gate electrode of the controller 340 may be coupled to a source line 349. The selector 330 and the selector 320 may be a PMOS transistor or a NMOS transistor.

In embodiments, a first resistance may exist between the source electrode 313 and the drain electrode 317 through a semiconductor well under the gate electrode 319. When the word line 339 may be low so that the selector 330 may be enabled, the bit line 329 may be high so that the selector 320 may be selected, and the source line 349 may be high so that the controller 340 may be off, and the gate electrode 319 may be in a high impedance, a current may be generated between the source electrode 313 and the drain electrode 317, which may create permanent defects, e.g., breaking a junction between a drain area and a semiconductor well in the MOSFET 310. After the programming operation, a second resistance may exist between the source electrode 313, the drain electrode 317, and a semiconductor well under the gate electrode 319. The first resistance may be about 104 to 106 times larger than the second resistance.

In embodiments, a sense amplifier may perform a sensing operation to detect a resistance between the source electrode 313, the drain electrode 317 of the MOSFET 310. During the sensing operation, the bit line 329 to the selector 320, which may be an NMOS transistor, may be turned on to select the MOSFET 310 to be read, and the controller 340, which may be a PMOS transistor, may be selected to raise the gate electrode 319 of the MOSFET 310 to be high so that the MOSFET 310 may be in an off state. If the MOSFET 310 is not programmed to store a bit, the resistance between the source electrode 313 and the drain electrode 317 may be from an off-state leakage for the MOSFET 310, which may be small. When the MOSFET 310 is programmed to store a bit, the gate electrode 319 may not shut off the channel conducting current between the source electrode 313 and the drain electrode 317, since a resistance between the source electrode 313 and the drain electrode 317 may be small. Hence, the sense amplifier may detect the current and may read the bit stored into the MOSFET 310.

Figure 5:
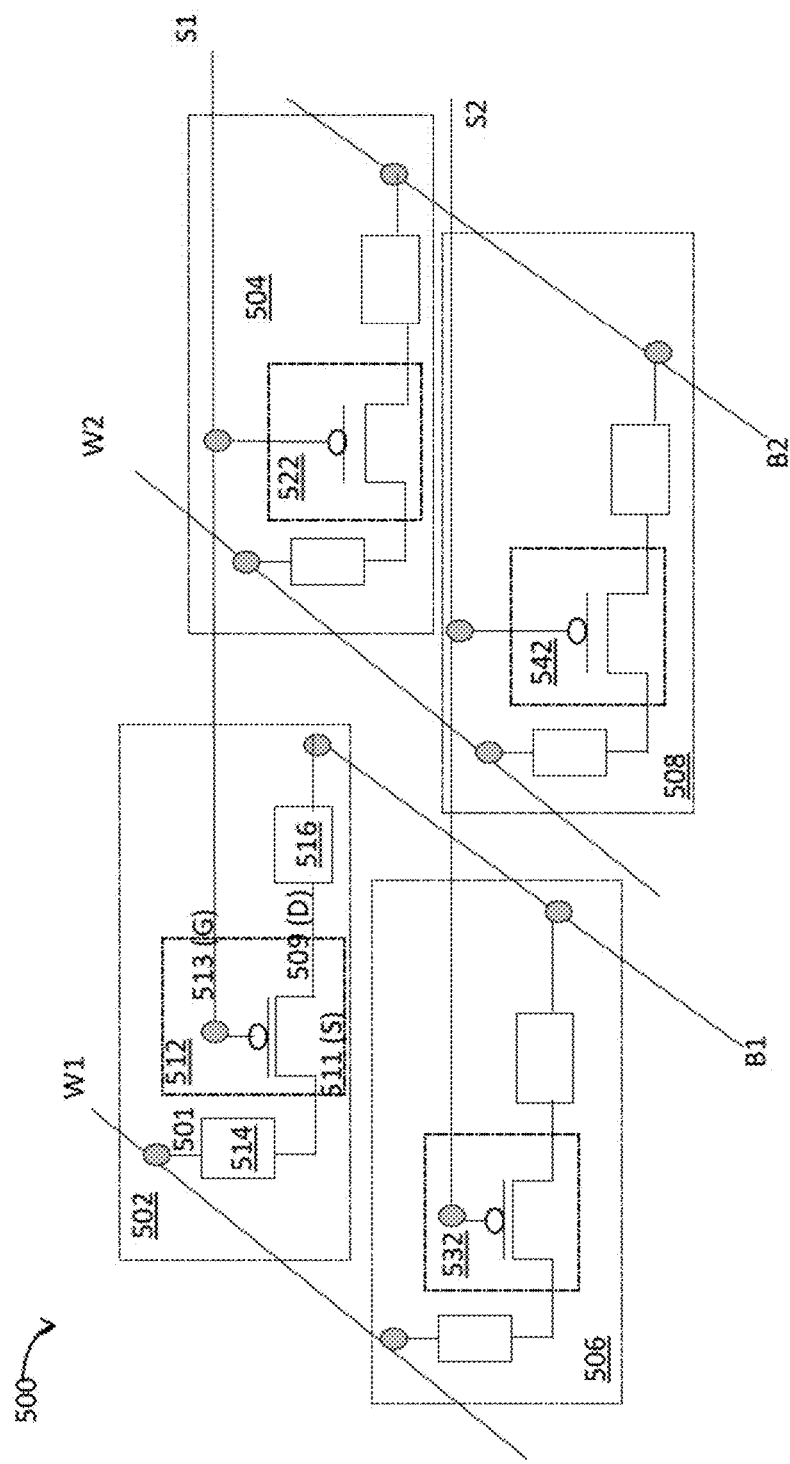
FIG. 5 schematically illustrates an antifuse memory array with multiple antifuse cells, where an antifuse cell includes an antifuse element having a floating body MOSFET, in accordance with some embodiments.

In addition, when the antifuse cell 301 is used in an antifuse memory array, e.g., an antifuse memory array 500 shown in FIG. 5, the controller 340 for the MOSFET 310 may be shared by multiple antifuse cells of the antifuse memory. As a result, the antifuse memory array may have reduced numbers of level shifters as compared to a traditional antifuse memory array, and reduced area of the peripheral circuitry.

In embodiments, as shown in FIG. 3(b), the antifuse cell 302 may include the MOSFET 350, which may be a NMOS MOSFET, coupled with a selector 360 and a selector 370. The MOSFET 350 may include a gate electrode 359, a source electrode 353, and a drain electrode 357. The MOSFET 350 may be used as an antifuse element. A programming operation may be performed when a programming voltage 351 may be applied to the source electrode 353 through the selector 370, the drain electrode 357 coupled to the ground voltage through the selector 360. The selector 370 may be coupled to a word line 379 through a gate electrode, and the selector 360 may be coupled to a bit line 369 through a gate electrode. In addition, the gate electrode 359 may be coupled to a high impedance, which may be controlled by a controller 380. For example, the controller 380 may be a NMOS transistor, with a gate electrode being held low so that the gate electrode 359 of the MOSFET 350 is in a high impedance. The gate electrode of the controller 380 may be coupled to a source line 389. The selector 360 and the selector 370 may be a NMOS transistor or a PMOS transistor.

In embodiments, a first resistance may exist between the source electrode 353 and the drain electrode 357 through a semiconductor well under the gate electrode 359. When the word line 379 may be low so that the selector 370 may be enabled, the bit line 369 may be high so that the selector 360 may be selected, and the source line 389 may be low so that the controller 380 may be off, and the gate electrode 359 may be in a high impedance, a current may be generated between the source electrode 353 and the drain electrode 357, which may create permanent defects, e.g., breaking a junction between a drain area and a semiconductor well in the MOSFET 350. After the programming operation, a second resistance may exist between the source electrode 353, the drain electrode 357, and a semiconductor well under the gate electrode 359. The first resistance may be about 104 to 106 times larger than the second resistance.

Figure 4:
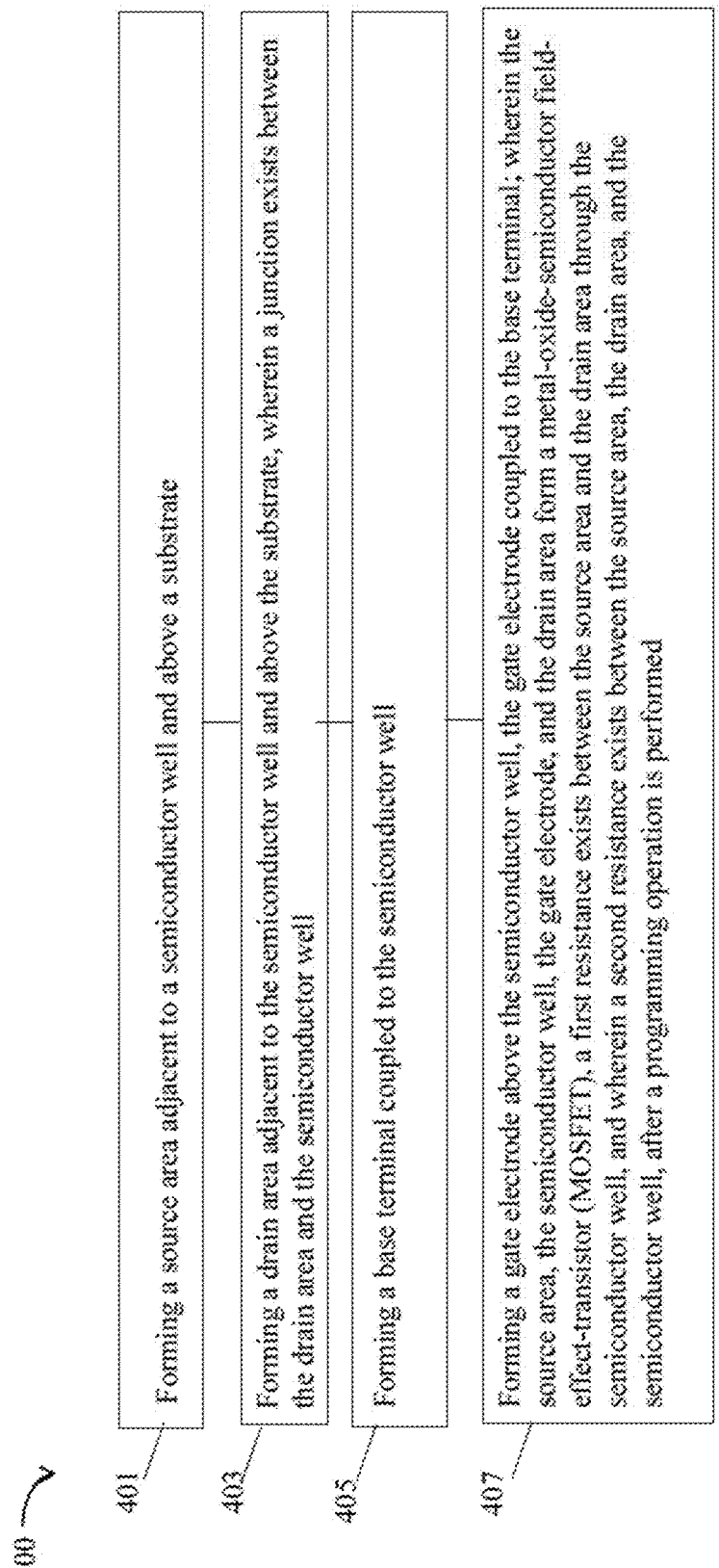
FIG. 4 schematically illustrates a process 400 for forming a floating body MOSFET having a junction between a drain area and a semiconductor well to be used as an antifuse element, in accordance with some embodiments.

FIG. 4 schematically illustrates a process 400 for forming a floating body MOSFET having a junction between a drain area and a semiconductor well to be used as an antifuse element, in accordance with some embodiments. In embodiments, the process 400 may be applied to form the MOSFET 100 in FIG. 1, the MOSFET 210, the MOSFET 220, in FIG. 2, the MOSFET 310, or the MOSFET 350 in FIG. 3.

At block 401, the process 400 may include forming a source area adjacent to a semiconductor well and above a substrate. For example, the process 400 may include forming the source area 103 adjacent to the semiconductor well 105 and above the substrate 101, as shown in FIG. 1.

At block 403, the process 400 may include forming a drain area adjacent to the semiconductor well and above the substrate, wherein a junction exists between the drain area and the semiconductor well. For example, the process 400 may include forming the drain area 107 adjacent to the semiconductor well 105 and above the substrate 101, where the junction 106 exists between the drain area 107 and the semiconductor well 105, as shown in FIG. 1.

At block 405, the process 400 may include forming a base terminal coupled to the semiconductor well. For example, the process 400 may include forming the base terminal 115 coupled to the semiconductor well 105, as shown in FIG. 1.

At block 407, the process 400 may include forming a gate electrode above the semiconductor well, where the gate electrode may be coupled to the base terminal. The source area, the semiconductor well, the gate electrode, and the drain area may form a MOSFET. A first resistance may exist between the source area and the drain area through the semiconductor well. A programming operation may be performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area. After the programming operation is performed, a second resistance may exist between the source area, the drain area, and the semiconductor well. For example, the process 400 may include forming the gate electrode 119 above the semiconductor well 105, where the gate electrode 119 may be coupled to the base terminal 115. The source area 103, the semiconductor well 105, the gate electrode 119, and the drain area 107 may form the MOSFET 100. A first resistance may exist between the source area 103 and the drain area 107 through the semiconductor well 105. A programming operation may be performed when the gate electrode 119 may be coupled to a high impedance, a programming voltage 111 may be applied at the source area 103, and the drain area 107 may be coupled to a ground voltage to break the junction 106 between the drain area 107 and the semiconductor well 105 to generate a current between the source area 103, the semiconductor well 105, and the drain area 107. After the programming operation is performed, a second resistance may exist between the source area 103, the drain area 107, and the semiconductor well 105.

In addition, the process 400 may include additional operations to form other layers, e.g., ILD layers, or encapsulation layers, insulation layers, not shown. In some embodiments, the various blocks, e.g., the block 401, the block 403, the block 405, and, the block 407 may not be ordered as shown in FIG. 4. Various blocks of the process 400 may be performed in an order different from the one shown in FIG. 4.

FIG. 5 schematically illustrates an antifuse memory array 500 with multiple antifuse cells, e.g., an antifuse cell 502, an antifuse cell 504, an antifuse cell 506, and an antifuse cell 508, where an antifuse cell may include an antifuse element having a floating body MOSFET, in accordance with some embodiments. For example, the antifuse cell 502, the antifuse cell 504, the antifuse cell 506, or the antifuse cell 508 may be an example of the antifuse cell 301 or the antifuse cell 302 in FIG. 3. The antifuse cell 502 includes an antifuse element 512, the antifuse cell 504 includes an antifuse element 522, the antifuse cell 506 includes an antifuse element 532, and the antifuse cell 508 includes an antifuse element 542. In embodiments, the antifuse element 512, the antifuse element 522, the antifuse element 532, and the antifuse element 542 may be similar to the MOSFET 100 in FIG. 1, the MOSFET 210, the MOSFET 220, in FIG. 2, the MOSFET 310, or the MOSFET 350 in FIG. 3, or a MOSFET to be used as an antifuse element formed following the process 400. In embodiments, the multiple antifuse cells may be arranged in a number of rows and columns coupled by bit lines, e.g., bit line B1 and bit line B2, source lines, e.g., source line S1, and source line S2, word lines, e.g., word line W1 and word line W2.

In embodiments, the multiple antifuse cells may be arranged in a number of rows and columns coupled by bit lines, e.g., bit line B1 and bit line B2, word lines, e.g., word line W1 and word line W2, and source lines, e.g., source line S1 and source line S2. The antifuse cell 502 may be coupled in parallel with the other antifuse cells of the same row, and may be coupled in parallel with the antifuse cells of the other rows. The antifuse memory array 500 may include any suitable number of one or more antifuse cells. Although the antifuse memory array 500 is shown in FIG. 5 with two rows that each includes two antifuse cells coupled in parallel, other embodiments may include other numbers of rows and/or numbers of antifuse cells within a row. In some embodiments, the number of rows may be different from the number of columns in an antifuse memory array. Each row of the antifuse memory array may have a same number of antifuse cells. Additionally, or alternatively, different rows may have different numbers of antifuse cells.

In embodiments, multiple antifuse cells, such as the antifuse cell 502, the antifuse cell 504, the antifuse cell 506, and the antifuse cell 508, may have a similar configuration, such as that a MOSFET coupled to two selectors. For example, the antifuse cell 502 may include a selector 514 and a selector 516 coupled to antifuse element 512 that may be a MOSFET. An antifuse cell, e.g., the antifuse cell 502, may be controlled through multiple electrical connections to read from the antifuse cells, write to the antifuse cells, and/or perform other memory operations.

In embodiments, when the antifuse element 512 is a MOSFET, the antifuse element 512 may be changed from one resistance to another resistance between a source electrode 511 and a drain electrode 509, while the gate electrode 513 may be in a high impedance. The different resistances between the source electrode 511 and the drain electrode 509 may be used to represent the two values of a bit, conventionally called 0 and 1. The antifuse element 512 may be individually controllable by the selector 514 and the selector 516, which may function as demonstrated in FIG. 3 for the antifuse cell 301 or the antifuse cell 302.

The bit line B1 of the antifuse memory array 500 may be coupled to a gate electrode of the selector 516. When the bit line B1 is active, the selector 516 may select the antifuse element 512. The word line W1 of the antifuse memory array 500 may be coupled to an electrode 501 of the selector 514. In addition, a bit line B1 of the antifuse memory array 500 may be coupled to another electrode, e.g., a drain electrode 509 of the antifuse element 512. In embodiments, the antifuse element 512 may be individually controllable by the selector 514 to switch between a first state and a second state. When the word line W1 is active, the selector 514 may select the antifuse element 512. A signal from the word line W1 may pass through the selector 514, further through the antifuse element 512, and reaching the other electrode, which is the bit line B1.

Figure 6:
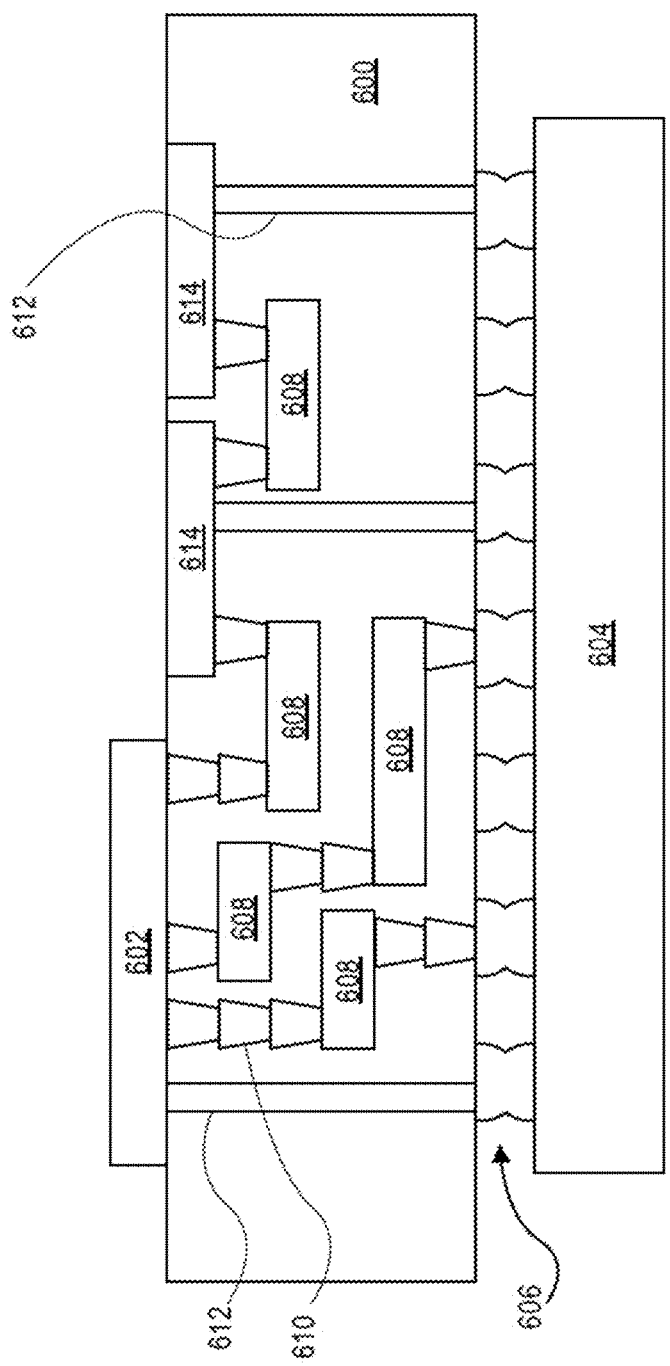
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 may be an intervening substrate used to bridge a first substrate 602 to a second substrate 604. The first substrate 602 may be, for instance, a substrate support for a MOSFET to be used as an antifuse element, e.g., the MOSFET 100 in FIG. 1, the MOSFET 210, the MOSFET 220, in FIG. 2, the MOSFET 310, or the MOSFET 350 in FIG. 3, or a MOSFET to be used as an antifuse element formed following the process 400. The second substrate 604 may be, for instance, a memory module, a computer motherboard, or another integrated circuit die. For example, the second substrate 604 may be a memory module including the antifuse memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. In further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, antifuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
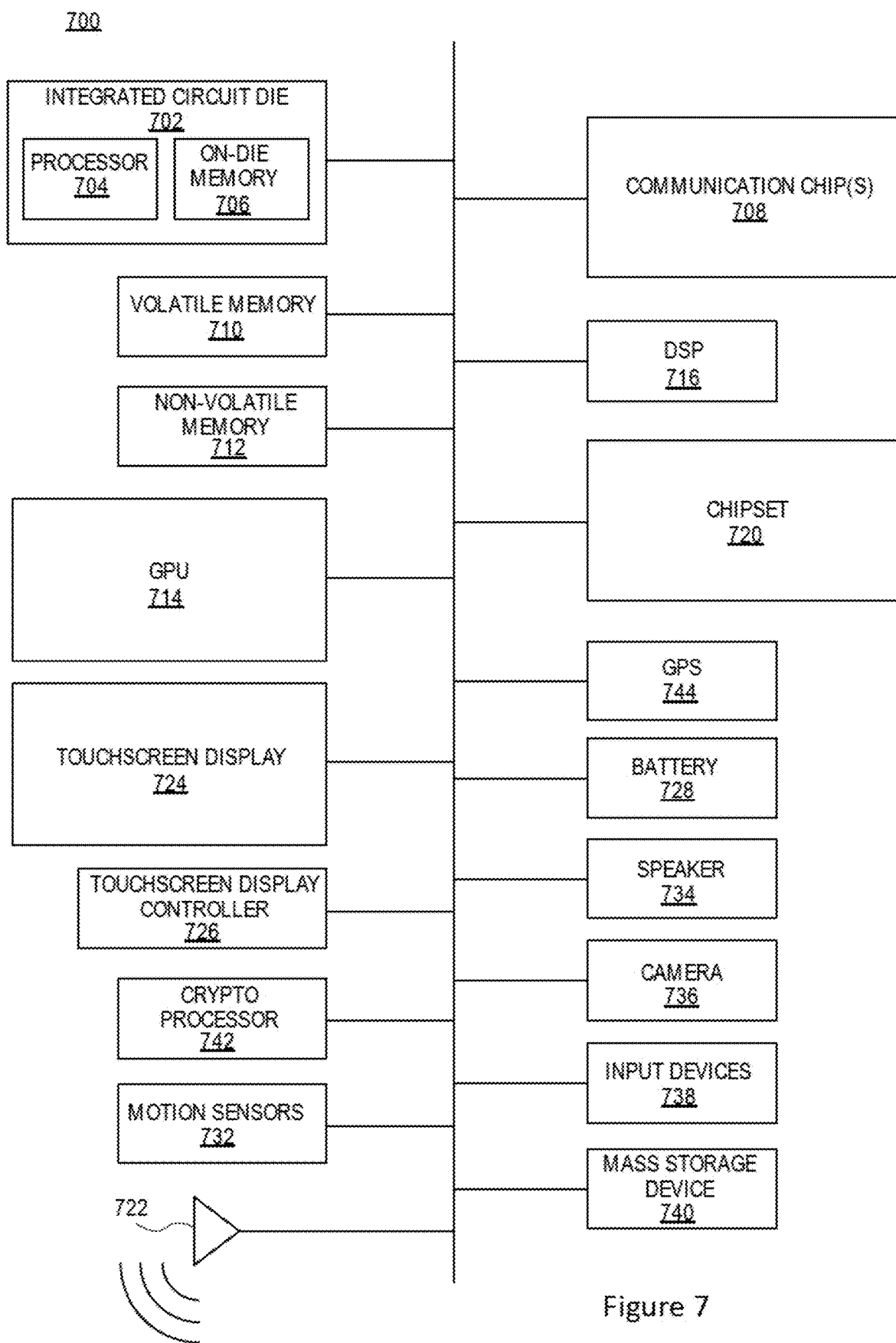
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include a MOSFET to be used as an antifuse element, e.g., the MOSFET 100 in FIG. 1, the MOSFET 210, the MOSFET 220, in FIG. 2, the MOSFET 310, or the MOSFET 350 in FIG. 3, a MOSFET to be used as an antifuse element formed following the process 400, or the antifuse memory array 500 shown in FIG. 5.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 728 or other power source, a power amplifier (not shown), a voltage regulator (not shown), a global positioning system (GPS) device 744, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as an antifuse memory array or antifuse elements, which are formed in accordance with implementations of the current disclosure, e.g., the MOSFET 100 in FIG. 1, the MOSFET 210, the MOSFET 220, in FIG. 2, the MOSFET 310, or the MOSFET 350 in FIG. 3, or a MOSFET to be used as an antifuse element formed following the process 400, or the antifuse memory array 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an integrated circuit (IC), comprising: a source area adjacent to a semiconductor well and above a substrate; a drain area adjacent to the semiconductor well and above the substrate, wherein a junction exists between the drain area and the semiconductor well; a base terminal coupled to the semiconductor well; and a gate electrode above the semiconductor well, the gate electrode coupled to the base terminal; wherein the source area, the semiconductor well, the gate electrode, and the drain area form a metal-oxide-semiconductor field-effect-transistor (MOSFET), a first resistance exists between the source area and the drain area through the semiconductor well, and wherein a second resistance exists between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

Example 2 may include the integrated circuit of example 1 and/or some other examples herein, wherein the substrate is a bulk substrate, a silicon-on-insulator (SOI) substrate, or a partial-depleted SOI substrate.

Example 3 may include the integrated circuit of example 1 and/or some other examples herein, wherein the MOSFET is a FinFET, or a planar MOSFET.

Example 4 may include the integrated circuit of example 1 and/or some other examples herein, wherein the semiconductor well is a n-type well or a p-type well.

Example 5 may include the integrated circuit of example 1 and/or some other examples herein, wherein the current is higher than sub-milliamp (mA).

Example 6 may include the integrated circuit of example 1 and/or some other examples herein, wherein the programming voltage is less than or equal to about 2.5 V.

Example 7 may include the integrated circuit of example 1 and/or some other examples herein, wherein the first resistance is about 104 to 106 times larger than the second resistance.

Example 8 may include the integrated circuit of example 1 and/or some other examples herein, wherein the gate electrode includes germanium (Ge), cobalt (Co), titanium (Ti), tantalum (Ta), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 9 may include the integrated circuit of example 1 and/or some other examples herein, wherein the programming operation is performed when the MOSFET is in an off state.

Example 10 may include the integrated circuit of example 1 and/or some other examples herein, further comprising: a sense amplifier to perform a sense operation to detect the MOSFET has been programmed when the gate electrode is to control the MOSFET in an off-state, and a current is detected between the source area and the drain area.

Example 11 may include the integrated circuit of example 1 and/or some other examples herein, further comprising: a first selector coupled to the drain electrode; a second selector coupled to the source electrode; and a gate controller to couple the gate electrode to a high impedance.

Example 12 may include the integrated circuit of example 11 and/or some other examples herein, wherein the first selector or the second selector is a NMOS transistor or a PMOS transistor.

Example 13 may include the integrated circuit of example 1 and/or some other examples herein, wherein the source area, the drain area, the base terminal, the semiconductor well, the gate electrode, and the MOSFET is a first source area, a first drain area, a first base terminal, a first semiconductor well, a first gate electrode, and a first MOSFET, respectively, and the integrated circuit further includes: a second semiconductor well isolated from the first semiconductor well by an isolation area; a second source area adjacent to the second semiconductor well and above the substrate; a second drain area adjacent to the second semiconductor well and above the substrate, wherein a second junction exists between the second drain area and the second semiconductor well; a second base terminal coupled to the second semiconductor well; a second gate electrode above the second semiconductor well, the second gate electrode coupled to the second base terminal; wherein the second source area, the second semiconductor well, the second gate electrode, and the second drain area form a second MOSFET, a third resistance exists between the second source area and the second drain area through the second semiconductor well, and wherein a fourth resistance exists between the second source area, the second drain area, and the second semiconductor well, after a programming operation is performed when the second gate electrode is coupled to a high impedance, a programming voltage is applied at the second source area, and the second drain area is coupled to a ground voltage to break the junction between the second drain area and the second semiconductor well to generate a current between the second source area, the second semiconductor well, and the second drain area.

Example 14 may include a method for forming an integrated circuit, the method comprising: forming a source area adjacent to a semiconductor well and above a substrate; forming a drain area adjacent to the semiconductor well and above the substrate, wherein a junction exists between the drain area and the semiconductor well; forming a base terminal coupled to the semiconductor well; and forming a gate electrode above the semiconductor well, the gate electrode coupled to the base terminal; wherein the source area, the semiconductor well, the gate electrode, and the drain area form a metal-oxide-semiconductor field-effect-transistor (MOSFET), a first resistance exists between the source area and the drain area through the semiconductor well, and wherein a second resistance exists between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

Example 15 may include the method of example 14 and/or some other examples herein, wherein the substrate is a bulk substrate, a silicon-on-insulator (SOI) substrate, or a partial-depleted SOI substrate.

Example 16 may include the method of example 14 and/or some other examples herein, wherein the MOSFET is a FinFET, or a planar MOSFET.

Example 17 may include the method of example 14 and/or some other examples herein, wherein the semiconductor well is a n-type well or a p-type well.

Example 18 may include the method of example 14 and/or some other examples herein, wherein the first resistance is about 104 to 106 times larger than the second resistance.

Example 19 may include the method of example 14 and/or some other examples herein, wherein the gate electrode includes germanium (Ge), cobalt (Co), titanium (Ti), tantalum (Ta), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 20 may include the method of example 14 and/or some other examples herein, wherein the programming operation is performed when the MOSFET is in an off state.

Example 21 may include a computing device, comprising: a circuit board; and an antifuse memory array coupled to the circuit board, wherein the antifuse memory array includes a plurality of antifuse cells, an antifuse cell of the plurality of antifuse cells includes an antifuse element coupled to a first selector and a second selector, and wherein the antifuse element includes: a source area adjacent to a semiconductor well and above a substrate, the source area coupled to a word line of the antifuse memory array through the first selector; a drain area adjacent to the semiconductor well and above the substrate, the drain area coupled to a bit line of the antifuse memory array through the second selector, wherein a junction exists between the drain area and the semiconductor well; a base terminal coupled to the semiconductor well; and a gate electrode above the semiconductor well, the gate electrode coupled to the base terminal, and coupled to a source line of the antifuse memory array; wherein the source area, the semiconductor well, the gate electrode, and the drain area form a metal-oxide-semiconductor field-effect-transistor (MOSFET), a first resistance exists between the source area and the drain area through the semiconductor well, and wherein a second resistance exists between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

Example 22 may include the computing device of example 21 and/or some other examples herein, wherein the first selector or the second selector is a PMOS transistor or a NMOS transistor.

Example 23 may include the computing device of example 21 and/or some other examples herein, wherein the MOSFET is a FinFET, or a planar MOSFET.

Example 24 may include the computing device of example 21 and/or some other examples herein, wherein the programming operation is performed when the MOSFET is in an off state.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
a source area adjacent to a semiconductor well and above a substrate;
a drain area adjacent to the semiconductor well and above the substrate, wherein a junction exists between the drain area and the semiconductor well;
a base terminal coupled to the semiconductor well; and
a gate electrode above the semiconductor well, the gate electrode coupled to the base terminal;
wherein the source area, the semiconductor well, the gate electrode, and the drain area form a metal-oxide-semiconductor field-effect-transistor (MOSFET), the MOSFET configurable to have a first resistance between the source area and the drain area through the semiconductor well, and the MOSFET configurable to have a second resistance between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

2. The integrated circuit of claim 1, wherein the substrate is a bulk substrate, a silicon-on-insulator (SOI) substrate, or a partial-depleted SOI substrate.

3. The integrated circuit of claim 1, wherein the MOSFET is a FinFET, or a planar MOSFET.

4. The integrated circuit of claim 1, wherein the semiconductor well is a n-type well or a p-type well.

5. The integrated circuit of claim 1, wherein the programming voltage is less than or equal to about 2.5 V.

6. The integrated circuit of claim 1, wherein the first resistance is about $10^4$ to $10^6$ times larger than the second resistance.

7. The integrated circuit of claim 1, wherein the gate electrode includes germanium (Ge), cobalt (Co), titanium (Ti), tantalum (Ta), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

8. The integrated circuit of claim 1, wherein the programming operation is performed when the MOSFET is in an off state.

9. The integrated circuit of claim 1, further comprising:
a sense amplifier to perform a sense operation to detect the MOSFET has been programmed when the gate electrode is to control the MOSFET in an off-state, and a current is detected between the source area and the drain area.

10. The integrated circuit of claim 1, further comprising:
a first selector coupled to the drain electrode;
a second selector coupled to the source electrode; and
a gate controller to couple the gate electrode to a high impedance.

11. The integrated circuit of claim 10, wherein the first selector or the second selector is a NMOS transistor or a PMOS transistor.

12. The integrated circuit of claim 1, wherein the source area, the drain area, the base terminal, the semiconductor well, the gate electrode, and the MOSFET is a first source area, a first drain area, a first base terminal, a first semiconductor well, a first gate electrode, and a first MOSFET, respectively, and the integrated circuit further includes:
a second semiconductor well isolated from the first semiconductor well by an isolation area;
a second source area adjacent to the second semiconductor well and above the substrate;
a second drain area adjacent to the second semiconductor well and above the substrate, wherein a second junction exists between the second drain area and the second semiconductor well;
a second base terminal coupled to the second semiconductor well;
a second gate electrode above the second semiconductor well, the second gate electrode coupled to the second base terminal;
wherein the second source area, the second semiconductor well, the second gate electrode, and the second drain area form a second MOSFET, the second MOSFET configurable to have a third resistance between the second source area and the second drain area through the second semiconductor well, and the second MOSFET configurable to have a fourth resistance between the second source area, the second drain area, and the second semiconductor well, after a programming operation is performed when the second gate electrode is coupled to a high impedance, a programming voltage is applied at the second source area, and the second drain area is coupled to a ground voltage to break the junction between the second drain area and the second semiconductor well to generate a current between the second source area, the second semiconductor well, and the second drain area.

13. A method for forming an integrated circuit, the method comprising:
forming a source area adjacent to a semiconductor well and above a substrate;
forming a drain area adjacent to the semiconductor well and above the substrate, wherein a junction exists between the drain area and the semiconductor well;
forming a base terminal coupled to the semiconductor well; and
forming a gate electrode above the semiconductor well, the gate electrode coupled to the base terminal;
wherein the source area, the semiconductor well, the gate electrode, and the drain area form a metal-oxide-semiconductor field-effect-transistor (MOSFET), the MOSFET configurable to have a first resistance between the source area and the drain area through the semiconductor well, and the MOSFET configurable to have a second resistance between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

14. The method of claim 13, wherein the substrate is a bulk substrate, a silicon-on-insulator (SOI) substrate, or a partial-depleted SOI substrate.

15. The method of claim 13, wherein the MOSFET is a FinFET, or a planar MOSFET.

16. The method of claim 13, wherein the semiconductor well is a n-type well or a p-type well.

17. The method of claim 13, wherein the first resistance is about $10^4$ to $10^6$ times larger than the second resistance.

18. The method of claim 13, wherein the gate electrode includes germanium (Ge), cobalt (Co), titanium (Ti), tantalum (Ta), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

19. The method of claim 13, wherein the programming operation is performed when the MOSFET is in an off state.

20. A computing device, comprising:
a circuit board; and
an antifuse memory array coupled to the circuit board, wherein the antifuse memory array includes a plurality of antifuse cells, an antifuse cell of the plurality of antifuse cells includes an antifuse element coupled to a first selector and a second selector, and wherein the antifuse element includes:
a source area adjacent to a semiconductor well and above a substrate, the source area coupled to a word line of the antifuse memory array through the first selector;
a drain area adjacent to the semiconductor well and above the substrate, the drain area coupled to a bit line of the antifuse memory array through the second selector, wherein a junction exists between the drain area and the semiconductor well;
a base terminal coupled to the semiconductor well; and
a gate electrode above the semiconductor well, the gate electrode coupled to the base terminal, and coupled to a source line of the antifuse memory array;
wherein the source area, the semiconductor well, the gate electrode, and the drain area form a metal-oxide-semiconductor field-effect-transistor (MOSFET), the MOSFET configurable to have a first resistance between the source area and the drain area through the semiconductor well, and the MOSFET configurable to have a second resistance between the source area, the drain area, and the semiconductor well, after a programming operation is performed when the gate electrode is coupled to a high impedance, a programming voltage is applied at the source area, and the drain area is coupled to a ground voltage to break the junction between the drain area and the semiconductor well to generate a current between the source area, the semiconductor well, and the drain area.

21. The computing device of claim 20, wherein the first selector or the second selector is a PMOS transistor or a NMOS transistor.

22. The computing device of claim 20, wherein the MOSFET is a FinFET, or a planar MOSFET.

23. The computing device of claim 20, wherein the programming operation is performed when the MOSFET is in an off state.

24. The computing device of claim 20, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera.

* * * * *